(12) United States Patent　　(10) Patent No.: US 7,918,940 B2
An et al.　　(45) Date of Patent: Apr. 5, 2011

(54) APPARATUS FOR PROCESSING SUBSTRATE

(75) Inventors: Ki-Choul An, HwaSeong (KR);
Young-Chul Joung, Suwon (KR);
Tae-Young Ha, HwaSeong (KR);
Jung-Won Chang, DaeGu Metropolitan (KR); Il-Ho Noh, SeongNam (KR);
Seung-Bae Lee, Suwon (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1422 days.

(21) Appl. No.: 11/342,610

(22) Filed: Jan. 31, 2006

(65) Prior Publication Data

US 2006/0174829 A1　　Aug. 10, 2006

(30) Foreign Application Priority Data

Feb. 7, 2005　(KR) .................. 10-2005-0011334
Mar. 4, 2005　(KR) .................. 10-2005-0018240
Mar. 31, 2005　(KR) .................. 10-2005-0027022

(51) Int. Cl.
*C23C 16/00*　(2006.01)
(52) U.S. Cl. ......... 118/719; 118/720; 118/721; 118/726
(58) Field of Classification Search .................. 118/718, 118/719, 720, 721; 204/298.23–298.25, 204/298.35
See application file for complete search history.

(56) References Cited

U.S. PATENT DOCUMENTS

| | | | | |
|---|---|---|---|---|
| 4,042,128 | A | * | 8/1977 | Shrader ........................ 414/287 |
| 4,498,416 | A | * | 2/1985 | Bouchaib ...................... 118/719 |
| 4,911,810 | A | * | 3/1990 | Lauro et al. ............... 204/192.12 |
| 6,179,925 | B1 | | 1/2001 | Schmitt et al. |
| 6,841,006 | B2 | | 1/2005 | Barnes et al. |
| 2002/0155632 | A1 | * | 10/2002 | Yamazaki et al. .............. 438/29 |
| 2003/0124764 | A1 | * | 7/2003 | Yamazaki et al. .............. 438/99 |
| 2004/0077113 | A1 | * | 4/2004 | Yamazaki et al. .............. 438/29 |
| 2009/0269492 | A1 | * | 10/2009 | No et al. .................... 427/255.6 |

FOREIGN PATENT DOCUMENTS

| | | |
|---|---|---|
| JP | 04-003914 | 1/1992 |
| JP | 09-279341 | 10/1997 |

(Continued)

OTHER PUBLICATIONS

Office Action for corresponding Korean Application No. 10-2005-0011334 dated Oct. 10, 2006 and English translation thereof.

(Continued)

*Primary Examiner* — Karla Moore
(74) *Attorney, Agent, or Firm* — Harness, Dickey & Pierce, P.L.C.

(57) ABSTRACT

In a substrate processing apparatus for forming thin layers on a substrate used for an organic light emitting diode, the apparatus includes a mask attaching chamber, a deposition chamber and a mask detaching chamber. The mask attaching chamber, the deposition chamber and the mask detaching chamber are provided with a transferring guide installed thereinside, and a substrate supporter for supporting the substrate moves along the transferring guide in or between the chambers. Thus, a time for processing the substrate and an area for the apparatus may be reduced. Also, the chambers are grouped in one or more, and a gate valve is installed between the grouped chambers for opening and closing a path between the grouped chambers. Accordingly, the chambers may be continuously maintained in a vacuum state when any one of the chambers is repaired.

21 Claims, 15 Drawing Sheets

FOREIGN PATENT DOCUMENTS

| | | |
|---|---|---|
| JP | 11-131232 | 5/1999 |
| JP | 2000-142389 | 5/2000 |
| JP | 2002-180241 | 6/2002 |
| JP | 2002334783 A * | 11/2002 |
| JP | 2002-348659 | 12/2002 |
| JP | 2002-334783 | 11/2003 |
| JP | 2005-213570 | 8/2005 |
| TW | 465013 | 11/2001 |
| TW | 485331 | 5/2002 |
| TW | 548730 | 8/2003 |
| TW | 559980 | 11/2003 |
| TW | 588403 | 5/2004 |
| WO | WO 03043067 A1 * | 5/2003 |

OTHER PUBLICATIONS

Office Action for corresponding Korean Application No. 10-2005-0011334 dated Jul. 28, 2006 and English translation thereof.

Office Action for corresponding Korean Application No. 10-2005-0018240 dated Jun. 5, 2006 and English translation thereof.

* cited by examiner

APPARATUS FOR PROCESSING SUBSTRATE

CROSS-REFERENCE TO RELATED APPLICATION

This application relies for priorities upon Korean Patent Applications No. 2005-11334 filed on Feb. 7, 2005, No. 2005-18240 filed on Mar. 4, 2005 and No. 2005-27022 filed on Mar. 31, 2005 the contents of which are herein incorporated by reference in their entireties.

BACKGROUND OF THE INVENTION

1. Field of the Invention

The present invention relates to an apparatus for processing a substrate. More particularly, the present invention relates to an apparatus for carrying out a process to form a thin film on a substrate applied to an organic light-emitting diode.

2. Description of the Related Art

Recently, information processing devices are rapidly developed to have various shapes and functions with rapid data processing speed. Such information processing devices have a display device for displaying the processed information. As the display device, a cathode ray tube type display device was mainly used, but a flat panel display device is recently used as the display device for the information processing devices since the flat panel display device has various properties, such as light weight, compact size, etc., as compared with the cathode ray tube type display device. Especially, an organic light-emitting diode (OLED) having various advantageous, such as thin thickness, low power consumption, bright image quality, high response speed, etc., in comparison with a liquid crystal display is spotlighted. This is because the OLED does not need a separate backlight unit.

In order to manufacture the OLED, many processes are required and a cluster type apparatus is mainly used for the processes. In the cluster type apparatus, process chambers are arranged to form a circle and a robot arm for transferring substrates between the process chambers is located at a center portion of the circle.

However, since the substrates are transferred by the robot arm, the processes require so many times to unload the substrates from the process chambers and load the substrates to the process chambers. Further, when numbers of the process chambers increases and the substrates become large in size, an area for the cluster type apparatus also increases.

SUMMARY OF THE INVENTION

The present invention provides a substrate processing apparatus capable of efficiently carrying out a deposition process for an organic light emitting diode.

The present invention also provides a substrate processing apparatus capable of successively performing a plurality of process.

In one aspect of the present invention, a substrate processing apparatus includes a plurality of process chambers, a transferring guide, at least one substrate supporter and a deposition material supplying member. The process chambers include a plurality of deposition chambers each which is provided with an opening formed through a sidewall thereof. The transferring guide is installed at an upper portion inside the deposition chambers. The substrate supporter supports a substrate while the substrate is moved between the deposition chambers and a process for the substrate is performed. The substrate supporter is coupled to the transferring guide such that the substrate supporter is moved along the transferring guide. The deposition material supplying member supplies a deposition material to the substrate supported by the substrate supporter and is disposed under the transferring guide positioned in the deposition chamber. The substrate supporter is moved between the process chambers through the opening along the transferring guide and the process for the substrate is performed while the substrate is supported by the substrate supporter coupled to the transferring guide.

A gate valve for opening or closing the opening may be provided between the process chambers to allow inner portions of the process chambers to be separated from each other. Inner portions of the deposition chambers are maintained in a vacuum state when the process for the substrate is performed.

Each of the process chambers may further include a mask attaching chamber and a mask detaching chamber. The mask attaching chamber provides a space in which a process for attaching a mask having a predetermined pattern to the substrate is performed. The mask attaching chamber is installed at a first side of the deposition chamber and provided with an opening through which the substrate is moved. The mask detaching chamber provides a space in which a process for detaching the mask from the substrate, and is installed at a second side of the deposition chamber and provided with an opening through which the substrate is moved.

The inner portions of the deposition chambers are maintained in a vacuum state when the process for the substrate is performed. The mask attaching chamber, the deposition chamber and the mask detaching chamber are divided into one or more groups, and the gate valve may open and close the opening installed between the groups of the mask attaching chamber, the deposition chamber and the mask detaching chamber.

The substrate may be a substrate used to fabricate an organic light emitting diode. The substrate supporter includes an adhere-layer formed on a lower face thereof and the substrate is attached to the substrate supporter by the adhere-layer.

The deposition material supplying member may include a supplying container for containing the deposition material and a heating member for heating the supplying container such that the deposition material is supplied to the substrate when the process for the substrate is performed.

The apparatus may further include a blocking plate through which an opening facing an upper portion of the deposition material supplying member is formed. The blocking plate is installed between the substrate attached to the substrate supporter and the deposition material supplying member. The blocking plate may prevent the deposition material supplied from the deposition material supplying member from being moved through the opening of the deposition chamber or deposited at the transferring guide.

The substrate supporter may be continuously moved along the transferring guide when the process for the substrate is performed. Also, the substrate supporter may be moved after the substrate supporter is stayed in a predetermined position by a predetermined time when the process for the substrate is performed.

The apparatus may further include a cover for covering an opening through which the deposition material in the deposition material supplying member is supplied to the deposition chamber.

The apparatus may further include a returning guide for returning the substrate supporter from which the substrate is detached. The returning guide is disposed on the transferring guide in the process chambers, and the substrate supporter moves the mask from the mask detaching chamber to the mask attaching chamber while returning along the transferring guide.

The apparatus may further include a mask returning member for moving the mask from the mask detaching chamber to the mask attaching chamber along transferring guide, and the deposition chamber provides a buffer space therein at which the mask returning member temporarily stays.

The buffer space is provided at an upper portion of the transferring guide of the deposition chamber. The buffer space is provided inside the mask attaching chamber and the mask detaching chamber are provided with a buffer space, at which the mask returning member temporarily stays.

The substrate supporter includes a supporting plate for supporting the substrate and a driving roller that rolls on an upper face of the transferring guide when the supporting plate is transferred along the transferring guide. The driving roller is combined with a lower face of the supporting plate.

The substrate supporter may further include a guide roller that rolls along a side face of the transferring guide in order to prevent deviation of the supporting plate from the transferring guide toward a direction substantially perpendicular to a longitudinal direction of the transferring guide when the supporting plate is transferred along the transferring guide.

The lower face of the supporting plate includes a center portion for supporting the substrate, an end portion at which the driving roller is installed and a first bend portion formed between the center portion and the end portion. The upper face of the transferring guide includes a road portion that makes contact with the driving roller and a second bend portion corresponding to the first bend portion.

The apparatus may further include a driver for driving the substrate supporter. The driver includes a rack gear formed on a sidewall of the supporting plate, a pinion gear combined with the rack gear, a first rotation axle rotated by a motor, a first magnetic substance into which the first rotation axle is inserted, a second rotation axle for rotating the pinion gear, the second rotation axle being substantially perpendicular to the first rotation axle and a second magnetic substance for transmitting a rotational force from the first rotation axle to the second rotation axle. The second rotation axle is inserted into the second magnetic substance and the second magnetic substance is substantially perpendicular to the first magnetic substance.

According to the above, a time for processing the substrate and an area at which the apparatus is installed may be reduced, and the chambers may be continuously maintained in a vacuum state when any one of the chambers is repaired.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not precluded the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
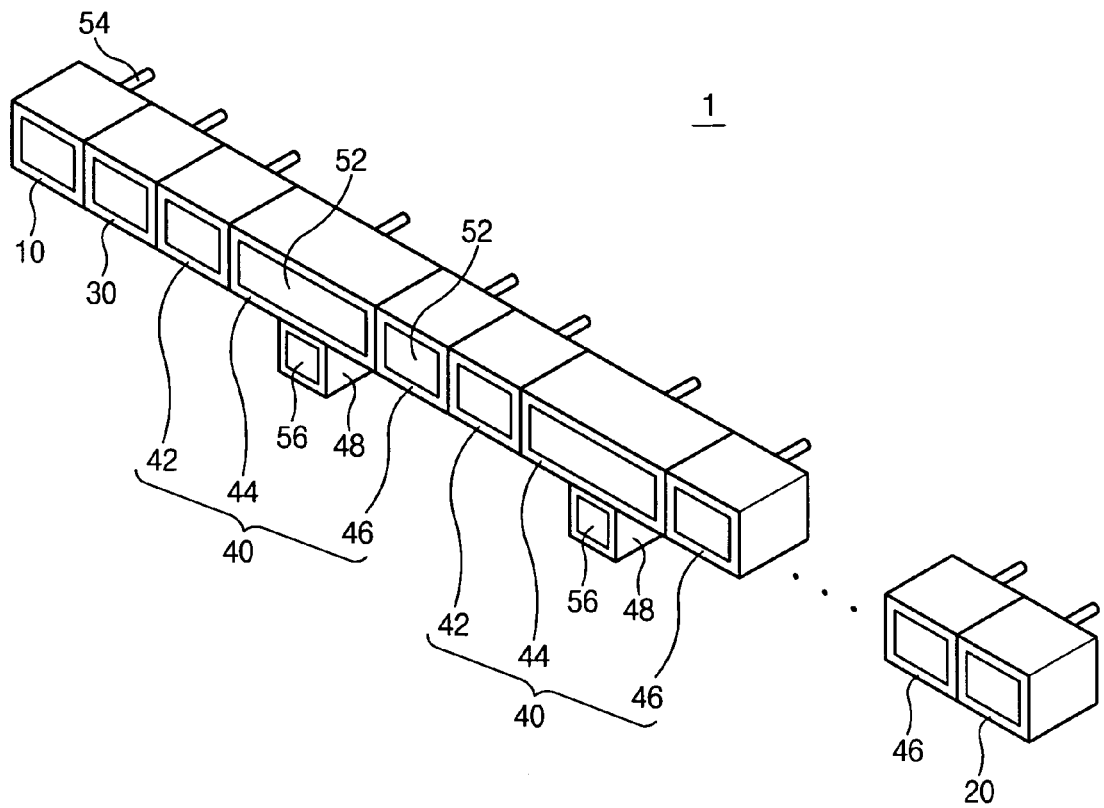
FIG. 1 is a perspective view showing a substrate processing apparatus according to an exemplary embodiment of the present invention.
Figure 2:
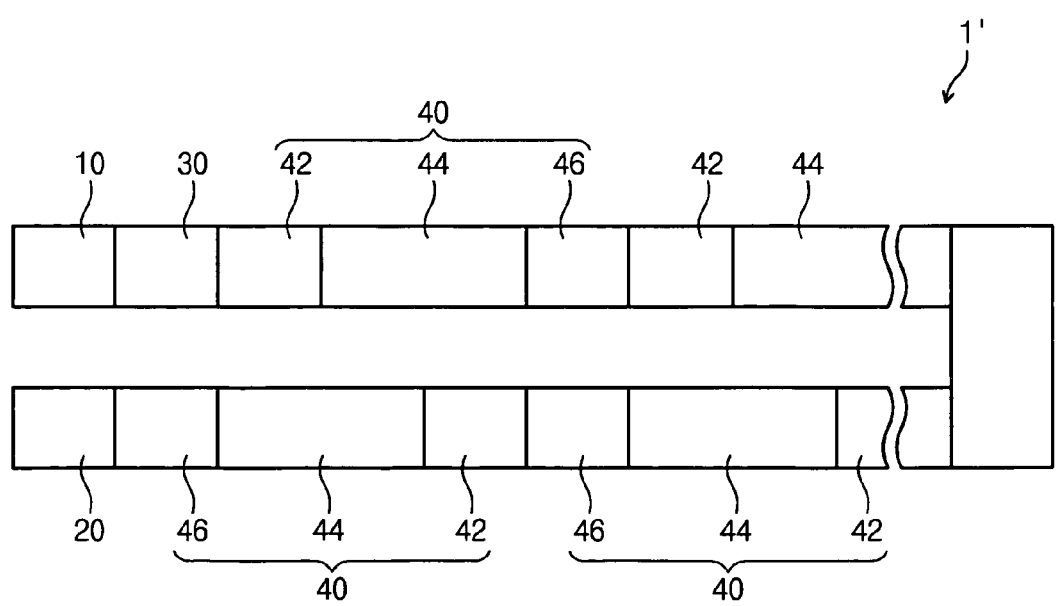
FIGS. 2 and 3 are plan views showing an arrangement of a substrate processing apparatus according to another exemplary embodiment of the present invention.
Figure 3:
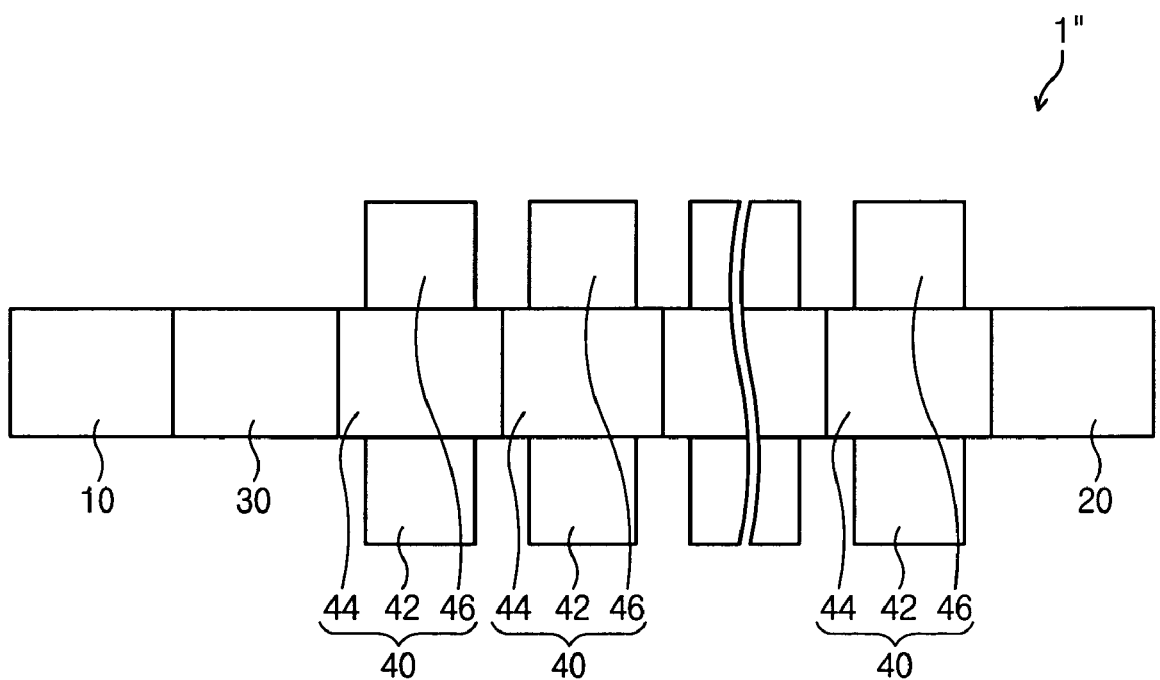

FIG. 1 is a perspective view showing a substrate processing apparatus according to an exemplary embodiment of the present invention. FIGS. 2 and 3 are plan views showing an arrangement of a substrate processing apparatus according to another exemplary embodiment of the present invention.

Referring to FIG. 1, a substrate processing apparatus 1 includes a plurality of chambers. The chambers include a loading chamber 10, a cleaning chamber 30, a process chamber 40 and an unloading chamber 20. The process chamber 40 includes a mask attaching chamber 42, a deposition chamber 44 and a mask detaching chamber 46. The substrate processing apparatus 1 may further include other chambers with the loading chamber 10, the cleaning chamber 30, the process chamber 40 and the unloading chamber 20. Selectively the process chamber 40 may include only the deposition chamber 44, and a mask attaching process and a mask detaching process may be performed in the deposition chamber 44.

In the present embodiment, the loading chamber 10, the cleaning chamber 30, the process chamber 40 and the unloading chamber 20 are sequentially arranged in a line. The mask attaching chamber 42, the deposition chamber 44 and the mask detaching chamber 46 are positioned in the process chamber 40 and also arranged in a same direction as that of the loading chamber 10, the cleaning chamber 30, the process chamber 40 and the unloading chamber 20. Further, number of chambers for the process chamber 40 may be varied, and thus the chambers of about 20 units may be applied to the substrate processing apparatus 1 as the process chamber 40 in case of an organic light emitting diode (OLED). Each of the chambers 10, 20, 30 and 40 may include a door for maintenance and management thereof. Also, each of the chambers 10, 20, 30 and 40 is connected with an exhaust pipe 54 at which a vacuum pump (not shown) is installed, which is used for maintaining an interior of the chambers 10, 20, 30 and 40 in a vacuum state during a substrate processing process.

As described above, the chambers 10, 20, 30 and 40 may be arranged in various configurations. For example, the chambers 10, 20, 30 and 40 may be arranged in a U shape as a substrate processing apparatus 1' shown in FIG. 2 or in a zigzag shape to allow an area in which the chambers 10, 20, 30 and 40 are arranged not to be lengthened. Further, the deposition chambers 44 are arranged in a line such that the deposition chambers 44 are adjacent to each other, and the mask attaching chamber 42 and the mask detaching chamber 46 may be arranged in a direction substantially perpendicular to a direction in which the deposition chambers 44 are arranged as a substrate processing apparatus 1" shown in FIG. 3.

For a deposition process, a substrate 3 is loaded into the substrate processing apparatus 1 through the loading chamber 10, and then the substrate 3 is unloaded from the substrate processing apparatus 1 through the unloading chamber 20 when the deposition process is finished. The substrate 3 loaded into the loading chamber 10 is transferred to the cleaning chamber 30. In the cleaning chamber 30, a cleaning process for cleaning the substrate 3 using plasma or an ultraviolet ray is carried out. When the cleaning process for the substrate 3 is finished, the substrate 3 is sequentially transferred to the mask attaching chamber 42, the deposition chamber 44 and the mask detaching chamber 46. In the mask attaching chamber 42, a mask on which a predetermined pattern is formed is attached on the substrate 3, a thin layer is deposited on the substrate 3 in the deposition chamber 44, and the mask on the substrate 3 is removed from the substrate 3 in the mask detaching chamber 46. Then, the substrate 3 is transferred to a next process chamber like the process chamber 40, and processes such as attaching the mask, depositing the thin layer and detaching the mask are repeatedly performed. In accordance with the process chamber 40, only the deposition process may be performed without performing the mask attaching process and the mask detaching process. In this case, the process chamber 40 does not include the mask attaching chamber 42 and the mask detaching chamber 46.

Although not shown in figures, a substrate transferring member is provided at a lower portion inside the loading chamber 10, the cleaning chamber 30 and the unloading chamber 20. In the present embodiment, the substrate transferring member may be an assembly having shafts each of which are substantially parallel to each other, rollers coupled to outer surfaces of the shafts, respectively, a motor and a belt applying a rotating force to the shafts.

Figure 4:
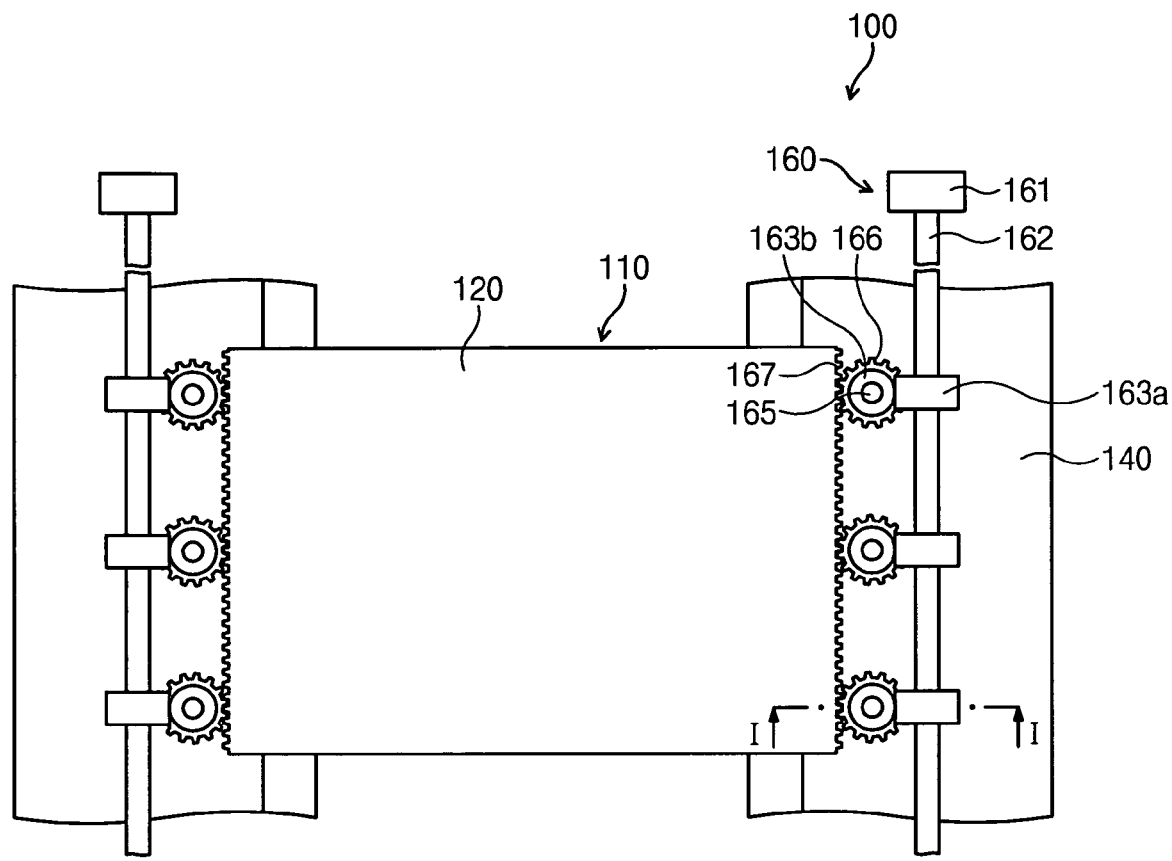
FIG. 4 is a plan view showing a substrate transferring apparatus according to an exemplary embodiment of the present invention.

FIG. 4 is a plan view showing a substrate transferring apparatus according to an exemplary embodiment of the present invention. A substrate transferring apparatus 100 transfers the substrate 3 inside the process chamber 40 and between the process chambers. Referring to FIG. 4, a substrate transferring apparatus 100 includes a substrate supporter 110, a transferring guide 140 and a driver 160. The substrate supporter 110 supports the substrate 3 during the substrate processing process and transfers the substrate 3 between the process chambers 40. In the substrate transferring apparatus 100, a plurality of substrate supporters are provided such that the substrate processing process is substantially simultaneously performed in each process chamber 40. The transferring guide 140 is provided inside the mask attaching chamber 42, the deposition chamber 44 and the mask detaching chamber 46 and guides the substrate supporter 110, thereby straightly moving the substrate supporter 110. The driver 160 applies a driving force to the substrate supporter 110 to be moved straightly.

Figure 5:
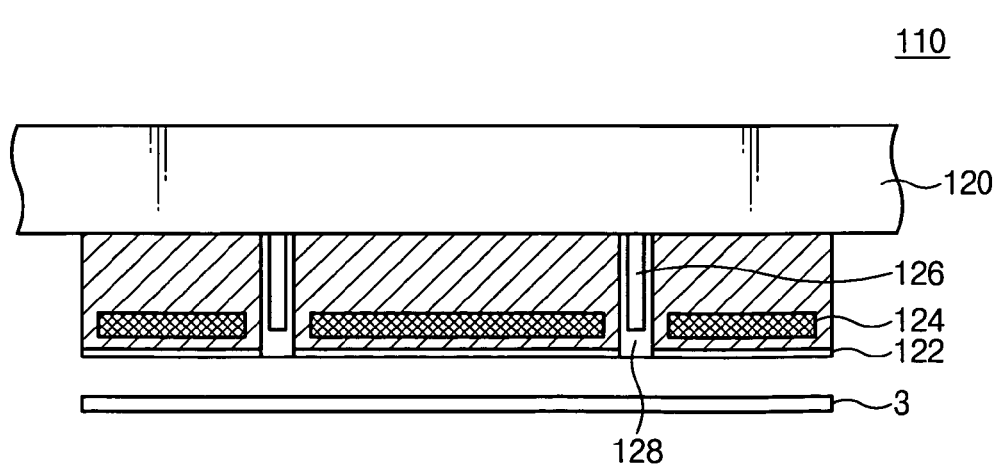
FIG. 5 is a cross-sectional view showing the substrate supporter shown in FIG. 4.

FIG. 5 is a cross-sectional view showing the substrate supporter shown in FIG. 4.

Referring to FIG. 5, the substrate supporter 110 includes a supporting plate 120. The substrate 3 is supported by a lower face of the supporting plate 120 such as a depositing face of the substrate 3 is downwardly positioned. The lower face of the supporting plate 120 includes a center portion 120a, a bend portion 120b and an end portion 120c. An adhere-layer 122 is formed on the center portion 120a of the supporting plate 120 to easily adhere the substrate 3 thereto. The supporting plate 120 is provided with a separation rod that is inserted into a hole formed in the supporting plate 120 and movable upwardly and downwardly. The adhere-layer 122 has an adhering force suitable to easily separate the substrate 3 from the supporting plate 120. As described above, the substrate supporter 110 may fix the substrate 3 thereto using a tool such as a clamp (not shown) or a combination of the tool and the adhere-layer 122. Also, the substrate supporter 110 includes a magnet 124 positioned therein and a mask 4 includes a metal material, to thereby prevent sag of the mask 4 coupled to the substrate supporter 110. In the present embodiment, the magnet 124 is a permanent magnet.

Figure 6:
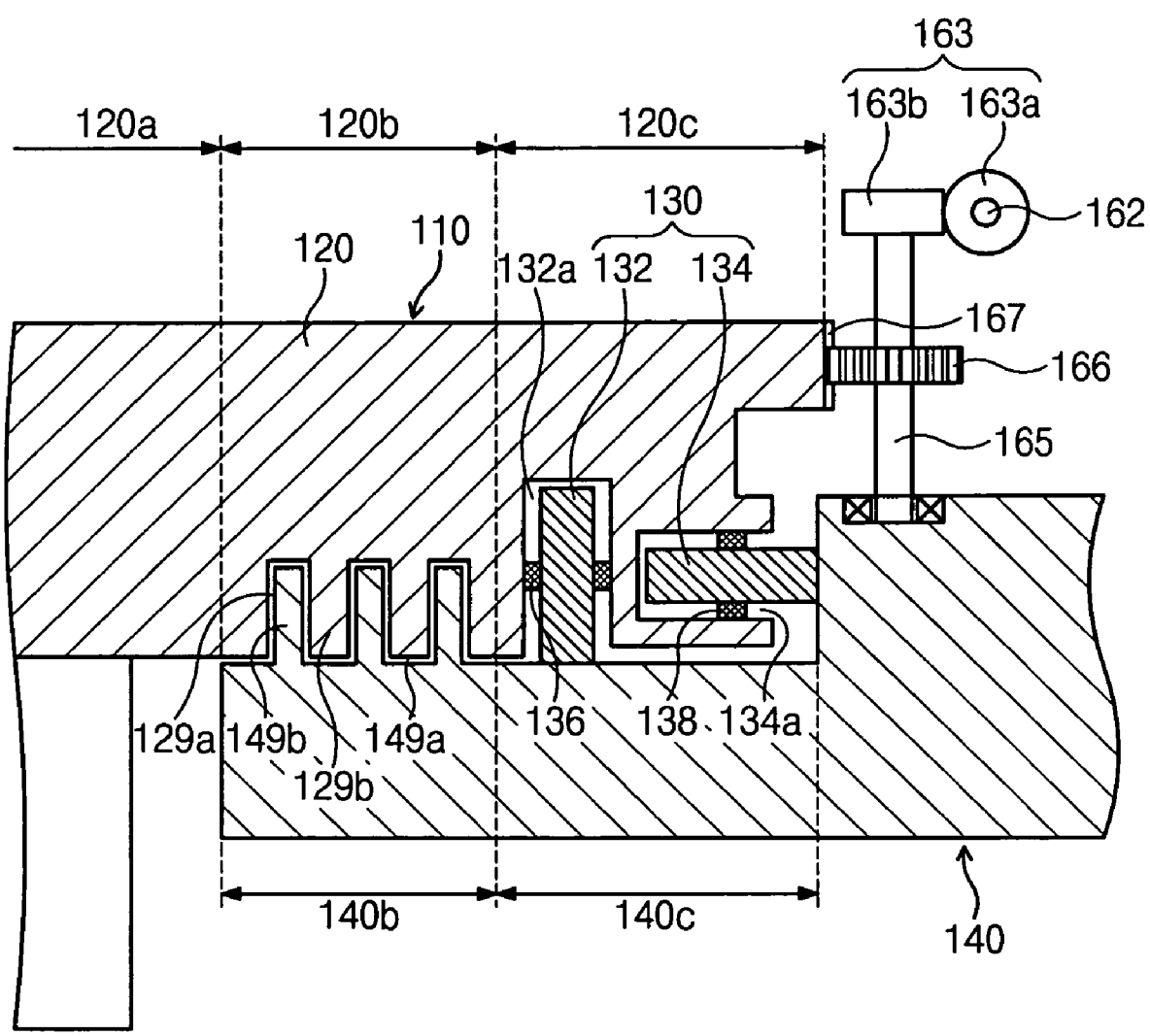
FIG. 6 is a cross-sectional view taken along a line I-I' of FIG. 4.

FIG. 6 is a cross-sectional view taken along a line I-I' of FIG. 4.

Referring to FIG. 6, a rolling member 130 is installed at the end portion 120c of the supporting plate 120. The rolling member 130 makes contact with the transferring guide 140 to allow the substrate supporter 110 to be easily moved along the transferring guide 140. The rolling member 130 includes driving rollers 132 and guide rollers 134. The driving rollers 132 are installed at the end portion of the lower face of the supporting plate 120 and rolled along an upper face of the transferring guide 140. The guide rollers 134 are installed at a side face of the supporting plate 120 and rolled along a side face of the transferring guide 140. The guide rollers 140 may prevent horizontal movement of the supporting plate 120 while the substrate 3 is transferred and while the mask 4 or the substrate 3 is coupled to or separated from the supporting plate 120.

A first insert groove 132a is formed at the end portion of the lower face of the supporting plate 120. The first insert groove 132a is formed in a same direction as a longitudinal direction of the transferring guide 140. A plurality of fixing axles 136 is coupled to both inner side faces of the first insert groove 132a. The driving rollers 132 are inserted into the first insert groove 132a such that the fixing axles 136 are coupled to the driving rollers 132, respectively. As another structure, insert grooves are formed in the same direction as the longitudinal direction of the transferring guide 140, which are spaced apart from each other, and then the fixing axles 136 and the driving rollers 132 may be installed inside the insert grooves, respectively.

Similarly, a second insert groove 134a is formed at a side face of the supporting plate 120. The second insert groove 134a is formed in the same direction as the longitudinal direction of the transferring guide 140. A plurality of fixing axles 138 is coupled to both an upper and lower faces of the second insert groove 134a. The guide rollers 134 are inserted into the second insert groove 134a such that the fixing axles 138 are coupled to the guide rollers 134, respectively.

The bend portion 120b is formed between the center portion 120a and the end portion 120c of the supporting plate 120. In the present embodiment, the bend portion 120b of the supporting plate 120 includes concave portions 129a and convex portions 129b. The concave portions 129a and the convex portions 129b are formed in a same direction as a direction to which the supporting plate 120 is moved. Also, the concave portions 129a and the convex portions 129b are alternately formed between the center portion 120a and the end portion 120c.

In the present embodiment, two transferring guides as the transferring guide 140 are applied to the substrate transferring apparatus 100. The two transferring guides are positioned at a same height, spaced apart from each other and parallel to each other. The transferring guide 140 includes a bend portion 140b and a road portion 140c formed on an upper face thereof. Hereinafter, the bend portion 120b of the supporting plate 120 and the bend portion 140b of the transferring guide 140 are defined as a first bend portion and a second bend portion, respectively. The road portion 140c has a flat upper face to provide a surface on which the driving rollers 132 are rolled, and the second bend portion 140b has a corresponding shape to that of the first bend portion 120b. That is, the second bend portion 140b includes a convex portion 149b corresponding to the concave portion 129a of the first bend portion 120b and a concavo portion 149a corresponding to the convex portion 129b. The first bend portion 120b and the second bend portion 140b may prevent particles from being flowed to the center portion 120a of the supporting plate 120, which are generated due to friction between the driving rollers 132 or the guide rollers 134 and the transferring guide 140, or between components of the driver 160. Further, the transferring guide 140 has a flat side face to provide a surface on which the guide rollers 134 are rolled.

The driver 160 applies the driving force to the substrate supporter 110 to be moved straightly. In the present embodiment, the driver 160 includes a first rotation axle 162, a transmission member 163, a second axle 165, a pinion gear 166 and a rack gear 167. The first rotation axle 162 is extended in a parallel direction to a longitudinal direction of the transferring guide 140. The motor 161 is combined with an end of the first rotation axle 162. The second rotation axle 165 is combined with the first rotation axle 162 and arranged in a substantially perpendicular direction to the first rotation axle 162. The second rotation axle 165 may be rotated by the transferring guide 140. A rotational force generated by the first rotation axle 162 is transmitted to the second rotation axle 165 by the transmission member 163.

The transmission member 163 includes a plurality of first magnetic substances 163a and a plurality of second magnetic substances 163b. The first magnetic substances 163a are coupled to the first rotation axle 162 by inserting the first rotation axle 162 into the first magnetic substances 163a. The first magnetic substances 163a are spaced apart from each other along the first rotation axle 162. The second magnetic substances 163b are installed at positions adjacent to the first magnetic substances 163a, respectively. Each of the second magnetic substances 163b is coupled to the second rotations axle 165. The second rotation axle 165 is provided with the pinion gear 166, and the rack gear 167 corresponding to the pinion gear 166 is formed at an upper portion of the side face of the supporting plate 120. The rack gear 167 is successively formed in a same direction as the direction to which the transferring guide 140 is moved. When the pinion gear 166 is rotated by the second rotation axle 165 and a rotational force from the pinion gear 166 is transmitted to the rack gear 167, the rack gear 167 is straightly moved along the same direction. According to the present embodiment, since the first and second magnetic substances 163a and 163b are used for transmitting the driving force between the first and second rotation axles 162 and 165, the particles may be prevented compared with a gear assembly. The driver 160 is applied to each of the chambers 10, 20, 30 and 40 and independently driven inside the chambers 10, 20, 30 and 40.

Although not shown in figures, a chucking chamber may be installed between the cleaning chamber 30 and the process chamber and an unchucking chamber may be installed between the unloading chamber 20 and the process chamber 40. The chucking chamber and the unchucking chamber may include the substrate transferring member same as that of the loading chamber 10 therein. In the chucking chamber, a chucking process for transferring the substrate 3 from the substrate transferring member to the substrate supporter 110 is performed. Also, an unchucking process for transferring the substrate 3 from the substrate supporter 110 to the substrate transferring member is performed in the unchucking chamber. On the other hand, the chucking process may be performed in the loading chamber 10 or the cleaning chamber 30, and the unchucking process may be performed in the unloading chamber 20. Further, the chucking chamber may be located between the loading chamber 10 and the cleaning chamber 30, thereby performing the cleaning process while the substrate 3 is fixed to the substrate supporter 110.

In the chucking chamber and the unchucking chamber, an elevator (not shown) for upwardly and downwardly moving the substrate 3 may be installed. When the substrate 3 is loaded on the elevator in the chucking chamber, the elevator is upwardly moved until a predetermined position to attach the substrate 3 to the lower face of the substrate supporter 110. For exactly attaching the substrate 3 to the lower surface of the substrate supporter 110, an additional process for aligning a position of the substrate 3 may be further performed. In the unchucking chamber, the elevator is downwardly moved until a predetermined position under the substrate supporter 110. Also, the separation rod 126 is downwardly moved to push the substrate 3 from the substrate supporter 110, so that the substrate 3 is separated from the substrate supporter 110 and located on the elevator. On the other hand, the substrate supporter 110 may be downwardly moved to chuck or unchuck the substrate 3 from the substrate transferring member.

Figure 7:
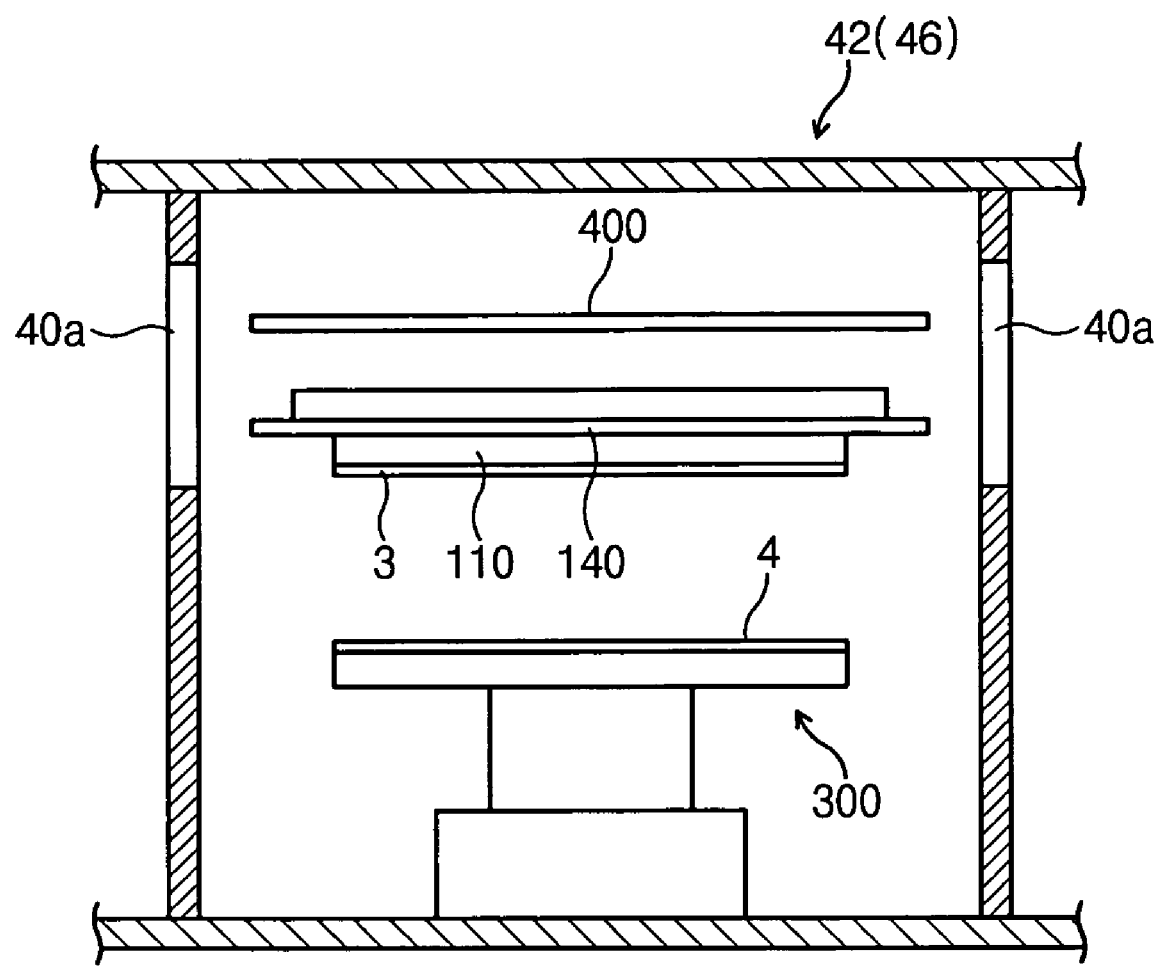
FIG. 7 is a cross-sectional view showing a mask attaching/detaching chamber according to an exemplary embodiment of the present invention.

FIG. 7 is a cross-sectional view showing a mask attaching/detaching chamber according to an exemplary embodiment of the present invention.

Referring to FIG. 7, the mask attaching chamber 42 and the mask detaching chamber 46 include a mask mover 300 therein. The mask mover 300 may be upwardly and downwardly moved and the mask 4 is disposed on the mask mover 300. The mask 4 has a predetermined pattern formed thereon to define an area on which the thin layer is formed. When the mask mover 300 is moved until a predetermined height in the mask attaching chamber 42, the mask 4 is coupled to the substrate supporter 110 by a clamp (not shown) applied to the substrate supporter 110. Before coupling the mask 4 to the substrate supporter 110, an alignment process between the substrate 3 and the mask 4 is performed. The mask 4 includes a metal material to allow the mask 4 to be combined with the magnet 124 of the substrate supporter 110, thereby preventing the mask 4 coupled to the substrate supporter 110 from being partially sagged. When the mask mover 300 is moved until a predetermined height in the mask detaching chamber 46, the clamp of the substrate supporter 110 releases the mask 4, and thus the mask 4 is separated from the substrate supporter 110 and located on the mask driver 300. The coupling and separating structure and method for the mask should not be limited to those exemplary embodiments but various changes and modifications can be made by one ordinary skilled in the art.

The substrate 3 to which the mask 4 is attached is transferred to the deposition chamber 44 for performing the deposition process.

Figure 8:
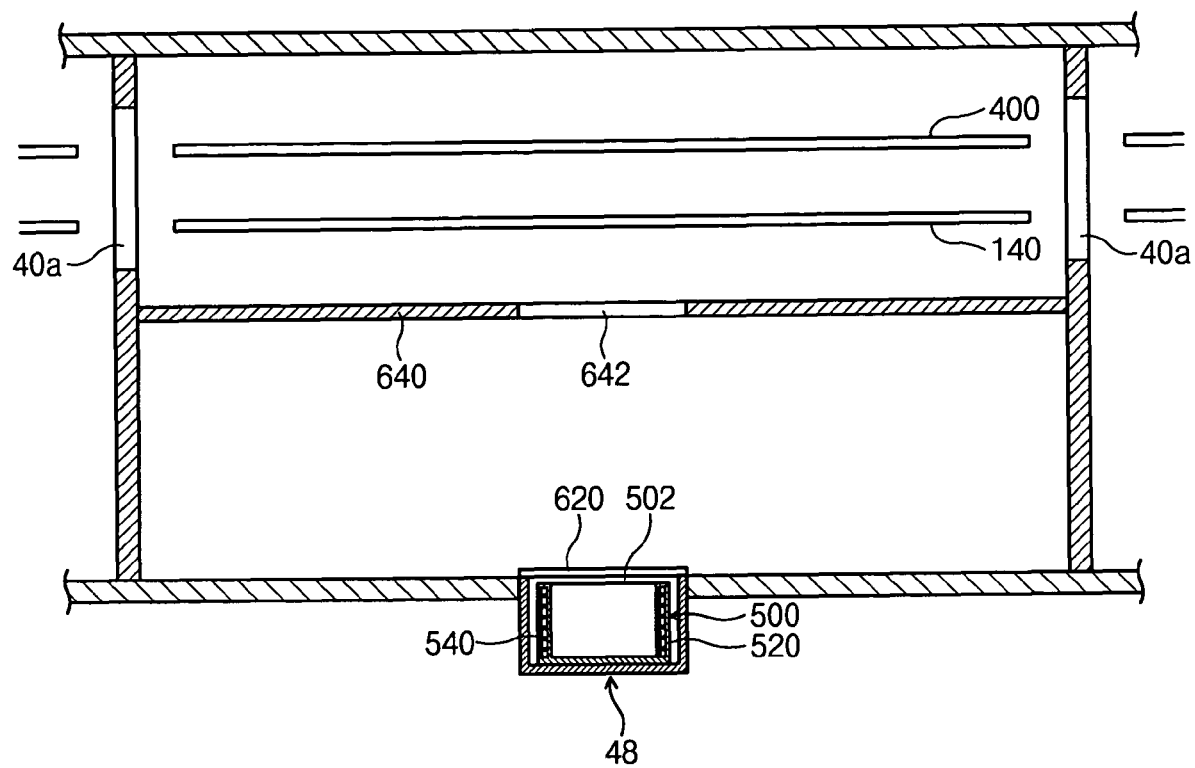
FIG. 8 is a cross-sectional view showing a deposition process according to an exemplary embodiment of the present invention.
Figure 9:
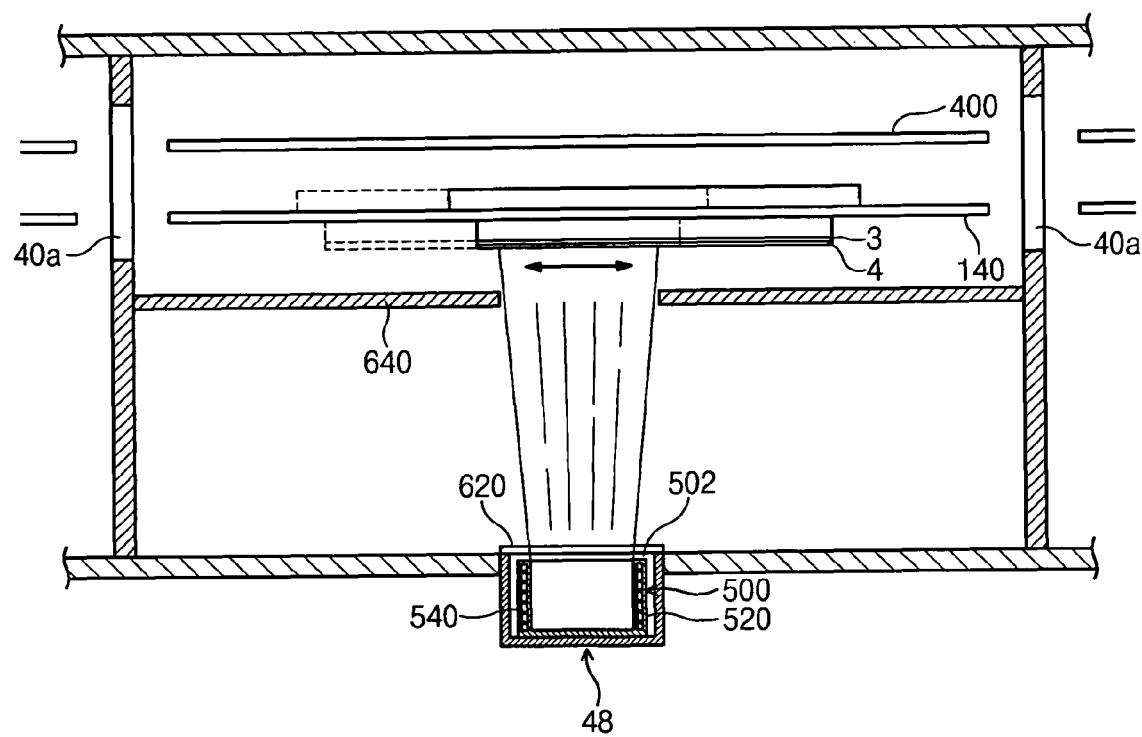
FIG. 9 is a cross-sectional view illustrating a deposition process performed in the deposition chamber of FIG. 8.
Figure 10:
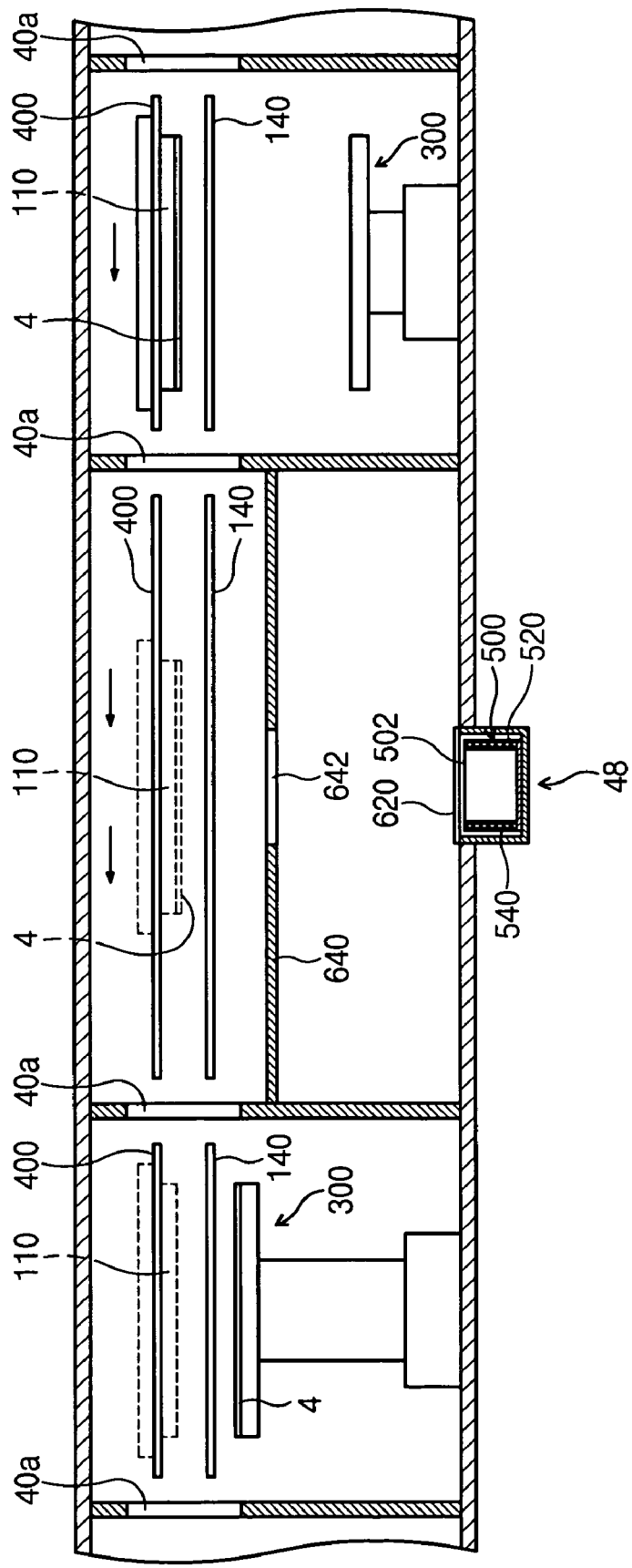
FIG. 10 is a cross-sectional view illustrating a detaching process of the mask in the substrate processing apparatus of FIG. 1.
Figure 11:
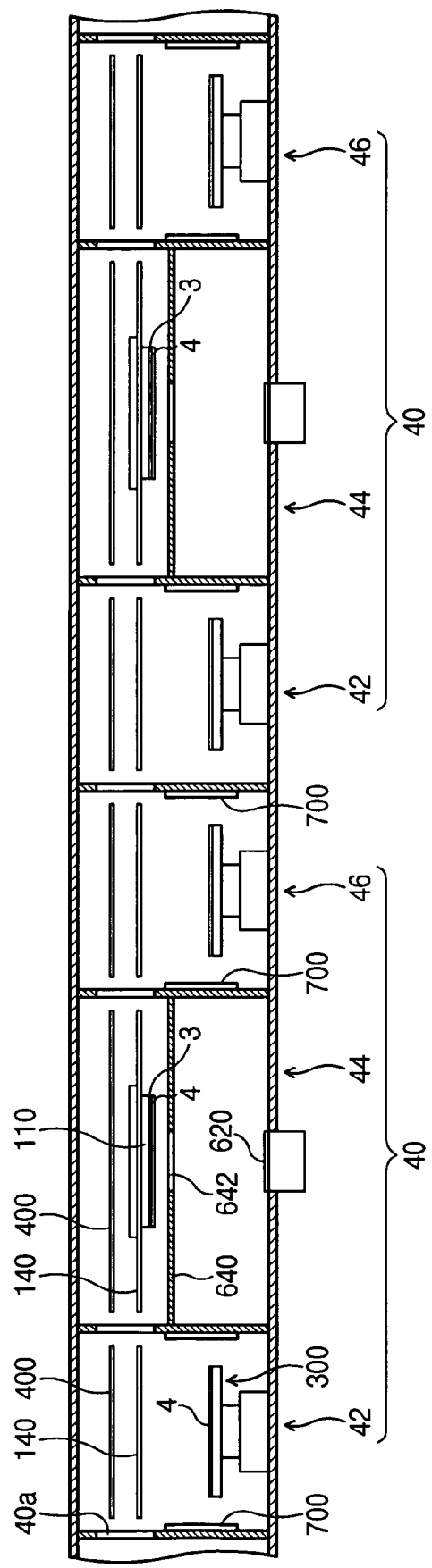
FIGS. 11 and 12 are cross-sectional views showing gate valves applied to the substrate processing apparatus of FIG. 1.
Figure 12:
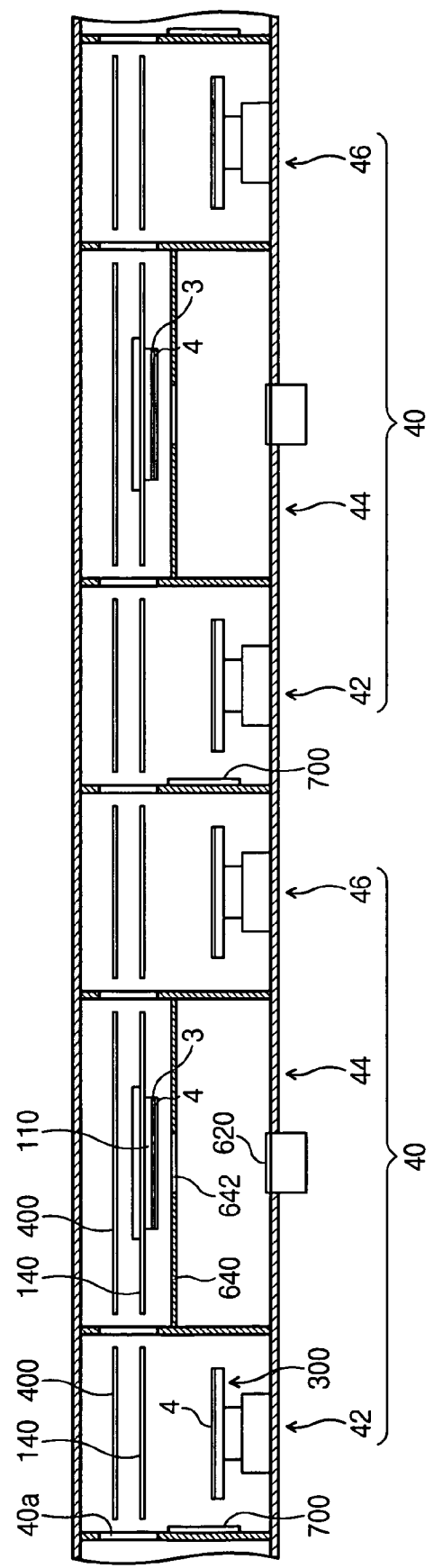

FIG. 8 is a cross-sectional view showing a deposition process according to an exemplary embodiment of the present invention. FIG. 9 is a cross-sectional view illustrating a deposition process performed in the deposition chamber of FIG. 8. FIG. 10 is a cross-sectional view illustrating a detaching process of the mask in the substrate processing apparatus of FIG. 1. FIGS. 11 and 12 are cross-sectional views showing gate valves applied to the substrate processing apparatus of FIG. 1.

Referring to FIG. 8, a deposition material supplying chamber 48 is disposed under the deposition chamber 44. The deposition material supplying chamber 48 may be integrally formed with the deposition chamber 44, or the deposition material supplying chamber 48 may be coupled to the deposition chamber 44 after the deposition material supplying chamber 48 is separately manufactured. The deposition material supplying chamber 48 includes a deposition material supplying member 500 applied therein. The deposition material supplying member 500 includes a supplying container 520 and a heating member 540. The supplying container 520 provides a receiving space into which a deposition material is received and an upper face of the supplying container 520 is opened. The heating member 540 heats the supplying container 520 such that a flume is generated from the deposition material. A pipe at which a vacuum pump is installed is connected to the deposition material supplying chamber 48, and the door 56 (refer to FIG. 1) is installed at a front face of the deposition material supplying chamber 48. In the present embodiment, an example of the heating member 540 may include a heat coil. The heating member 540 may be installed at an inner sidewall of the supplying container 520 or to surround the inner sidewall of the supplying container 520. To generate the flume from the deposition material, a laser irradiator (not shown) may be applied to the deposition chamber 44 in lieu of the heating member 540. In the present embodiment, the deposition material supplying chamber 48 separately applied to the deposition chamber 44 has been described but the deposition material supplying chamber 48 may be installed inside the deposition chamber 44.

In case that the substrate 3 has a small size, the deposition process is performed after the substrate supporter 110 is fixed to a position facing the deposition material supplying chamber 48. However, in case that the substrate 3 has a large size, the deposition process is partially and repeatedly performed with respect to the substrate 3 while the substrate supporter 110 is moved along the transferring guide 140. That is, the deposition process may be performed while the substrate supporter 110 is continuously moved at a uniform speed or while the substrate supporter 100 is stopped by a predetermined time and then moved. During performing the deposition process, the substrate supporter 110 may be reciprocated in the deposition chamber 44. As another exemplary embodiment, the deposition process may be performed while the supply container 520 is moved. However, since a configuration of the deposition chamber 44 is so complicated when the supply container 520 is moved to perform the deposition process, it is preferred that the substrate supporter 110 is moved along the transferring guide 140 for the deposition process.

Also, a chamber for transferring the substrate 3 may be provided with the transferring guide 140 for the deposition chamber 44 of the process chamber 40. But, a size of the process chamber 40 becomes large and a process for transferring the substrate 3 to another chamber is needed. Moreover, a process time for the deposition increases, and it is difficult to provide a structure for transferring the substrate 3 having the large size.

Further, the process chamber 40 includes a cover 620 for opening/closing an upper portion of the supplying container 520 or an opening of the deposition material supplying chamber 48. The cover 620 prevents the flume generated from the deposition material from being flowed into the deposition chamber 44 while the deposition process is not performed (the substrate 3 is not disposed on the deposition material supplying chamber 48). When the flume is flowed into the deposition chamber 44, the flume is deposited at the transferring guide 140 or an inner portion of the deposition chamber 44, thereby generating the particles.

During performing the deposition process, when the flume generated from the deposition material is flowed toward an upper portion of the substrate 3, the flume is deposited to the substrate supporter 110 or another member inside the deposition chamber 44. Also, when the flume is dispersed inside the deposition chamber 44, the dispersed flume may be flowed into another chamber through an opening 40*a*, which is adjacent to the chamber 44, to thereby contaminating another chamber. In order to prevent the contamination of another chamber adjacent to the deposition chamber 44, a blocking plate 640 is provided inside the deposition chamber 44. The blocking plate 640 is installed at a lower position than that the substrate 3 attached to the substrate supporter 110. The blocking plate 640 is provided with an opening 642 that is formed therethrough and corresponding to the opening 502 of the deposition material supplying chamber 48. Since the flume is supplied to the upper of the deposition chamber 44 through the opening 642 of the blocking plate 640, an area to which the flume generated from the deposition material may be limited as a predetermined area on the substrate 3.

The process chamber 40 may further include a returning guide 400 disposed on the transferring guide 140. The returning guide 400 faces the transferring guide 140 and has a same structure as that of the transferring guide 140. When the substrate 3 is separated from the substrate supporter 110 in the unchucking chamber, the substrate supporter 110 is returned to the chucking chamber along the returning guide 400. Also, the mask 4 detached from the substrate 3 in the mask detaching chamber 46 is transferred to the mask attaching chamber 42. In the present embodiment, as shown in FIG. 10, the mask 4 is returned to the mask attaching chamber 42 by the substrate supporter 110 returned through the returning guide 400. That is, the substrate supporter 110 returns the mask 4 from the mask detaching chamber 46 and transfers the returned mask 4 to the mask attaching chamber 42. The substrate supporter 110 repeatedly performs the returning operation whenever the substrate supporter 110 passes through the process chamber 40. On the other hand, the mask 4 and the substrate supporter 110 may be stacked at a predetermined position in lieu of automatically returning the mask 4 and the substrate supporter 110.

When the deposition process is performed, the process chamber 40 maintains an inner space thereof in a high vacuum state. However, when the process chamber 40 is repaired, the process chamber 40 maintains the inner space thereof in an atmosphere pressure state. Thus, all chambers are maintained in the atmosphere pressure state when any of chambers is repaired since the chambers are connected to each other through openings like the opening 40a. As a result, a long time is needed to start a next process because all chambers have to be maintained in the high vacuum state when the repair process is completed. For reducing the time, the substrate processing apparatus 1 includes gate valves 700 for opening and closing the opening 40a of each of the chambers. The gate valves 700 may be installed every between the chambers as shown in FIG. 11. However, when the gate valves 700 are formed every between the chambers, a manufacturing cost of the substrate processing apparatus 1 increases. Thus, after the chambers are divided in a plurality of groups, the gate valves 700 may be installed between the groups of the chambers.

In the present embodiment, the mask attaching chamber 42, the deposition chamber 44 and the mask detaching chamber 46 may be configured in a process chamber group as shown in FIG. 12. In this case, the gate valves 700 are provided between the chambers except the process chamber group and between the process chamber group and chambers adjacent to the process chamber group. When any of the chambers is repaired, the chamber that will be repaired may be separated from the adjacent chambers.

Figure 13:
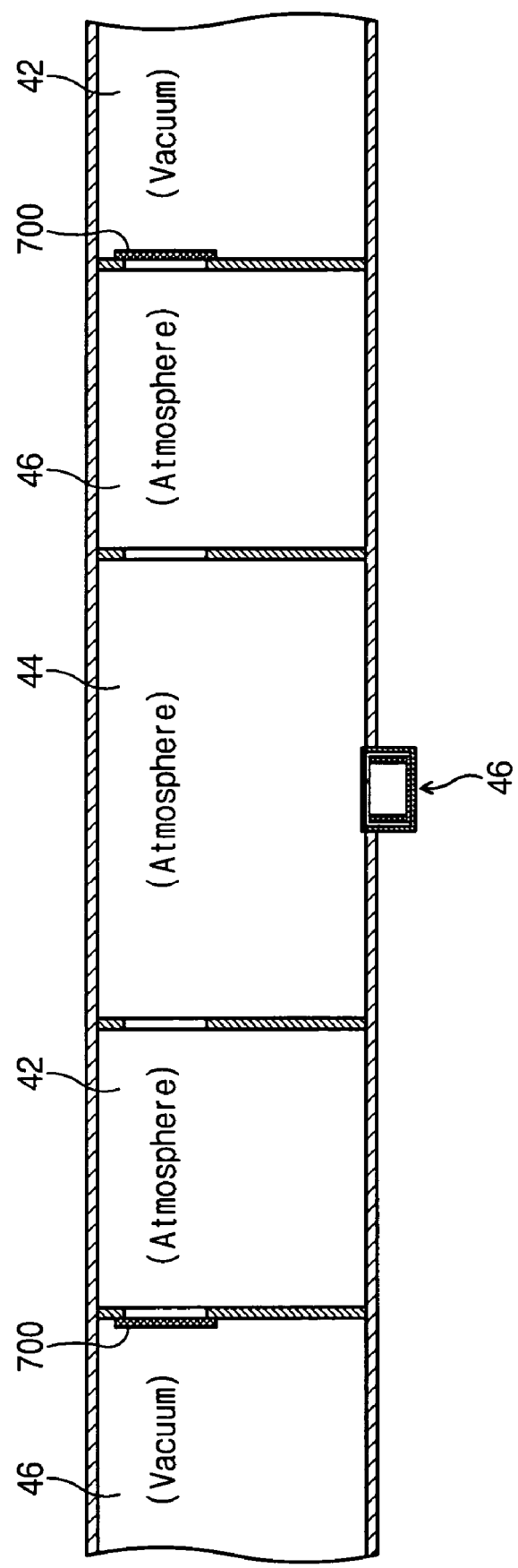
FIG. 13 is a view showing a vacuum state inside the chambers when any of the chambers is repaired.

FIG. 13 is a view showing a vacuum state inside the chambers when any of the chambers is repaired. In FIG. 13, a case where the process chamber 40 including the mask attaching chamber 42, the deposition chamber 44 and the mask detaching chamber 44 is repaired will be described as an exemplary embodiment of the present invention.

Referring to FIG. 13, the gate valves 700 installed at the chambers adjacent to the process chamber 40 are closed and the door 52 corresponding to the process chamber 40 is opened. As a result, the pressure of the process chamber 40 is maintained in the atmosphere state, and the pressure of the chambers except the process chamber 40 is maintained in the high vacuum state. When finished the repair process, the door 52 of the process chamber 40 is closed and the pressure of the process chamber 40 is changed again into the high vacuum state. Thus, the time needed to repair the process chamber 40 may be reduced, thereby efficiently improving an operation rate of the substrate processing apparatus 1.

Figure 14:
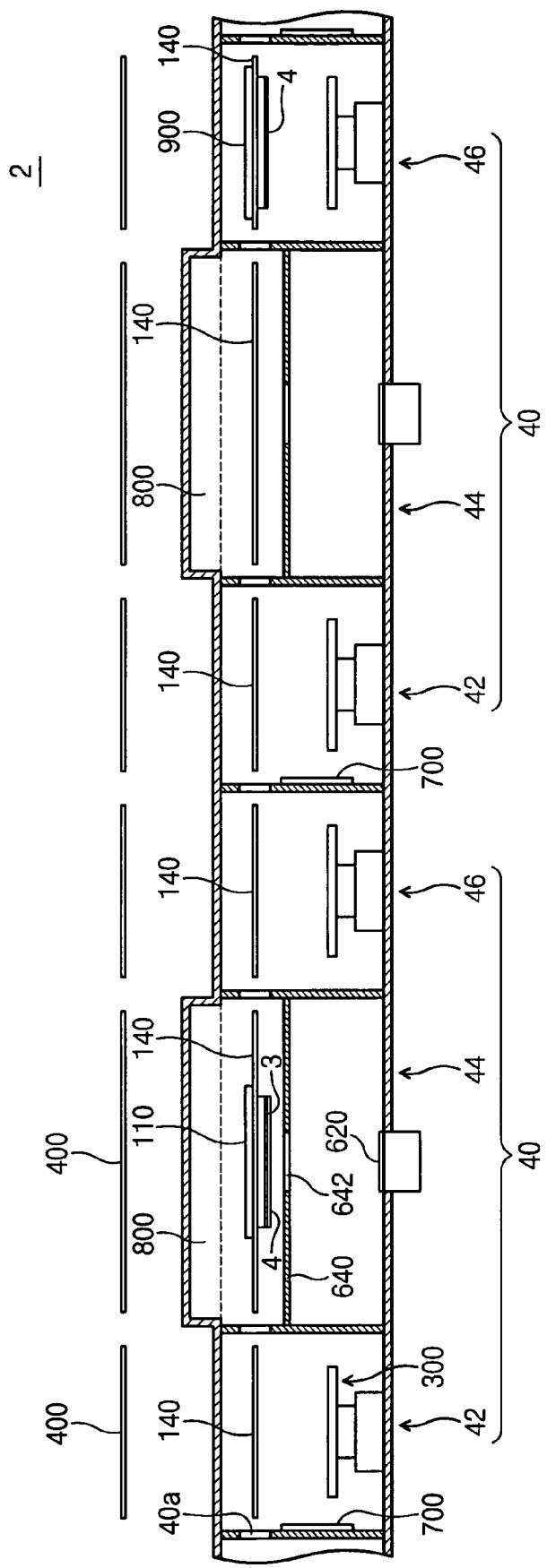
FIG. 14 is a view showing a substrate processing apparatus according to another exemplary embodiment of the present invention.
Figure 15:
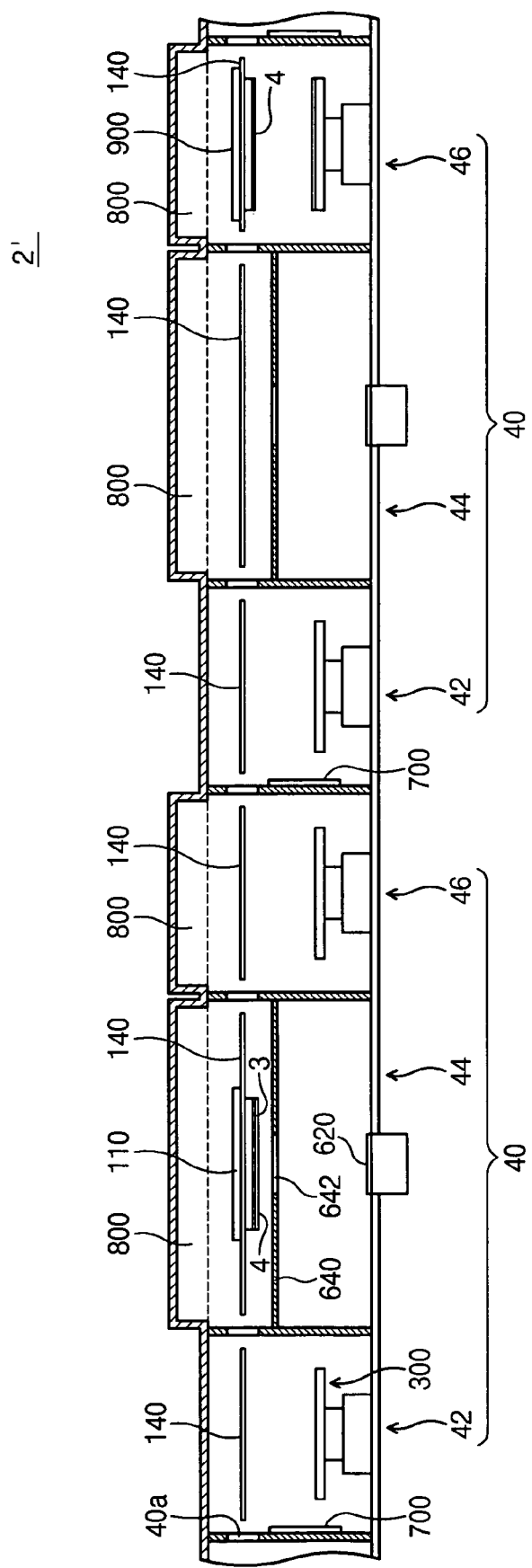
FIG. 15 is a view showing the substrate processing apparatus of FIG. 14 according to another exemplary embodiment of the present invention.

FIG. 14 is a view showing a substrate processing apparatus according to another exemplary embodiment of the present invention. FIG. 15 is a view showing the substrate processing apparatus of FIG. 14 according to another exemplary embodiment of the present invention. In FIG. 14, the same reference numerals denote the same elements in FIG. 1, and thus the detailed descriptions of the same elements will be omitted.

Referring to FIG. 14, a substrate processing apparatus 2 further includes a mask returning member 900 for returning the mask 4 from the mask detaching chamber 46 to the mask attaching chamber 42. The returning guide 400 for returning the substrate supporter 110 is provided outside the process chamber 40. The mask returning member 900 moves along the transferring guide 140. The mask returning member 900 may collide with the substrate supporter 110 inserting into the process chamber 40 while the mask returning member 900 is returned. In order to prevent collision between the mask returning member 900 and the substrate supporter 110, a buffer space 800 in which the mask returning member 900 may be temporarily stayed is provided in the deposition chamber 44. The buffer space 800 is provided at an upper inside portion of the deposition chamber 44 such that the mask returning member 900 is easily moved.

When the mask returning member 900 is moved, the mask returning member 900 may be elevated toward the buffer space 800 in the deposition chamber 44 to avoid collision between the mask returning member 900 and the substrate supporter 110. When the substrate supporter 110 is unloaded from the deposition chamber 44 after the process for depositing the thin layer on the substrate 3 attached to the substrate supporter 110 is finished, the mask returning member 900 is coupled to the transferring guide 140 and moved to the mask attaching chamber 42.

The mask returning member 900 may have a similar structure to that of the substrate supporter 110. The mask returning member 900 may attach the mask 4 thereto using magnetism, a mechanical member such as a clamp or a combination of the magnetism and the mechanical member. Although not shown in FIG. 14, the mask returning member 900 may be upwardly and downwardly moved between the transferring guide 140 and the buffer space 800. For example, the mask returning member 900 may have a transferring member (not shown) coupled thereto, such as a cylinder for upwardly and downwardly moving an object.

In order to prevent collision between the substrate supporter 110 and the mask returning member 900, the substrate processing apparatus 2 may further include a sensor (not shown) and a controller (not shown). The sensor senses a position of the substrate supporter 110 and provides a sensed signal to the controller. The controller controls movement of the mask returning member 900 in response to the sensed signal provided from the sensor. For preventing the collision between the substrate supporter 110 and the mask returning member 900, a program considering of various factors, such as a moving distance of the substrate supporter 110, a moving distance of the mask returning member 900, a time of which the mask returning member 900 is moved to the buffer space 800, a time of which the mask returning member 900 is stayed in the buffer space 800, etc., may be programmed in the substrate supporter 110 or the mask returning member 900.

When the mask 4 is returned, the mask returning member 900 may be stayed in the buffer space 800. As shown in FIG.

15, the buffer space 800 may be further applied to the mask attaching chamber 42 or the mask detaching chamber 46 with the deposition chamber 44.

According to the substrate processing apparatus 2 shown in FIG. 14, since the mask returning member 900 is moved along the transferring guide 140, an additional guide member is not needed to guide the mask returning member 900. Further, the size of the opening 40a installed between the process chambers 40 becomes small since the mask 4 used in the process chambers 40 is moved only in the process chambers 40, so that the size of the gate valves for the opening 40a also becomes small.

Figure 16:
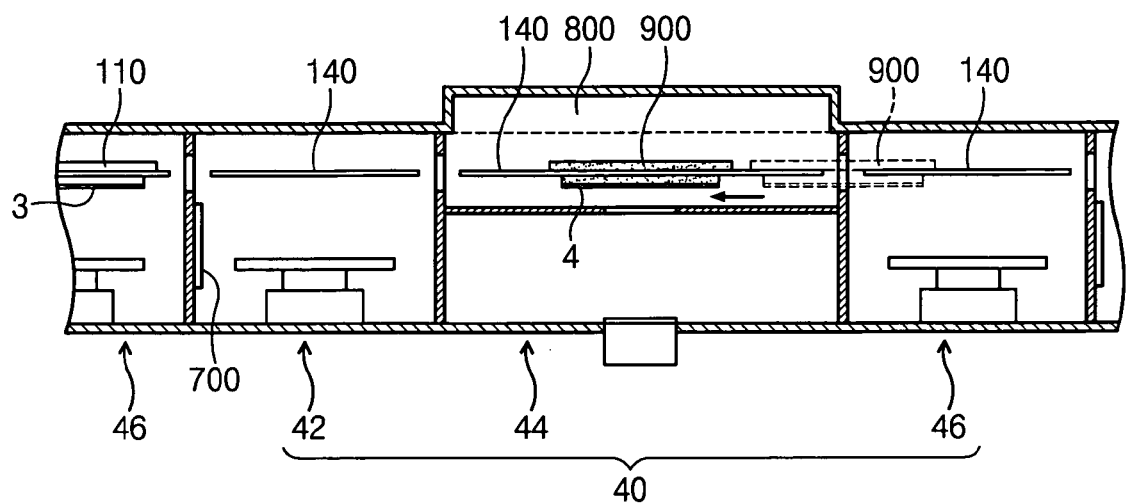
FIGS. 16 to 18 are views illustrating a process for returning a mask using the substrate processing apparatus shown in FIG. 14.
Figure 17:
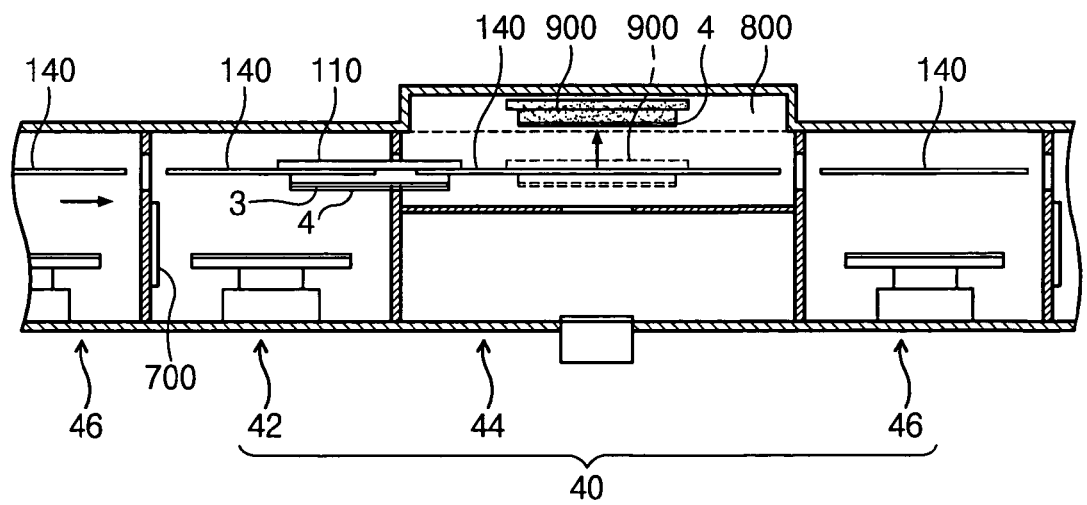
Figure 18:
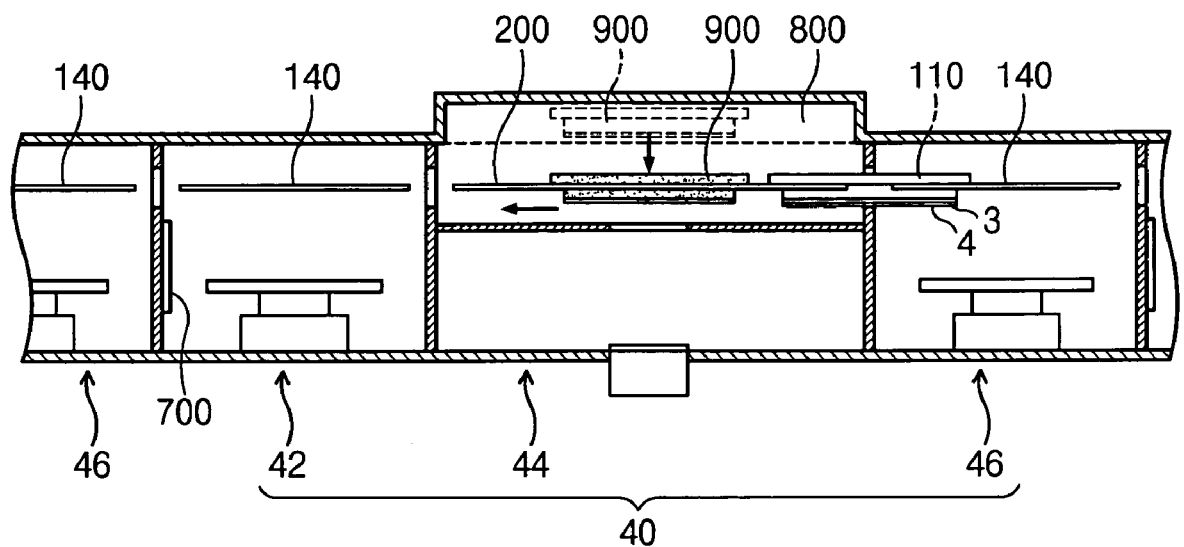

FIGS. 16 to 18 are views illustrating a process for returning a mask using the substrate processing apparatus shown in FIG. 14.

Referring to FIGS. 16 to 18, when the mask 4 is loaded on the mask returning member 900 in the mask detaching chamber 46, the mask returning member 900 is moved to the deposition chamber 44 along the transferring guide 140 (refer to FIG. 16). The mask returning member 900 returns the mask 4 to the mask attaching chamber 42 and is moved to the mask detaching chamber 46 or the buffer space 800 in case that the mask returning member 900 does not collide with the substrate supporter 110 while the mask 4 is returned. However, in case that the mask returning member 900 collies with the substrate supporter 110 before the mask returning member 900 arrives in the mask attaching chamber 42, the mask returning member 900 is moved to the buffer space 800 applied in the deposition chamber 44 (refer to FIG. 17). Then, the deposition process for the substrate 3 attached to the substrate supporter 110 is performed in the deposition chamber 44. When the substrate supporter 110 is transferred to the mask detaching chamber 46 after the deposition process is finished, the mask returning member 900 is coupled to the transferring guide 140 and moved to the mask attaching chamber 42 (refer to FIG. 18). After then, the mask returning member 900 is moved to the buffer space 800 or the mask detaching chamber 46 for repeatedly performing the deposition process.

According to the above, the transferring guide for guiding the substrate supporter supporting the substrate is applied inside the deposition chamber of which the deposition process is performed, thereby reducing an area for the substrate processing apparatus. Also, since the deposition process for the substrate is performed while the substrate supporter coupled to the transferring guide is moved to the deposition chamber, the time for the deposition process may be reduce.

Further, the gate valves are installed between the process chambers or the grouped process chambers, so that the chambers may maintain the high vacuum state thereinside when any one of the chambers is repaired. Thus, when the substrate processing process is continuously performed, the time needed to re-operate the substrate processing apparatus may be reduced.

Also, the mask returning process is independently performed in each of the process chambers. Thus, the numbers of the gate valves may be reduced since the mask returning member is not needed to be moved between the process chambers through the opening.

Also, since the mask returning member and the substrate transferring member are moved along the transferring guide and the buffer space is provided inside the deposition chamber, the substrate process apparatus may prevent collision between the mask returning member and the substrate transferring member, to thereby simplify the structure of the substrate processing apparatus.

Also, the driving rollers and the guide rollers that are rolled along the transferring guide are coupled to the substrate supporter, so that the substrate supporter may be easily repaired and maintained because the substrate supporter may be separated from the chambers.

Also, the bend portion is applied between the portion of the substrate supporter, at which the driving and guide rollers are installed, and the portion of the substrate supporter, that is supporting the substrate, thereby preventing attachment of the particles generated due to the friction between the driving or guide rollers and the transferring guide.

Further, the magnetic substance is employed as the transmission member for transmitting the rotational force between the shafts, to thereby reduce the particles compared to when the gear assembly is employed as the transmission member.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A substrate processing apparatus comprising:
 a plurality of process chambers having a plurality of deposition chambers, each of the deposition chambers being provided with an opening formed through a sidewall thereof;
 a transferring guide installed at an upper portion inside the deposition chambers;
 at least one substrate supporter for supporting a substrate while the substrate is moved between the deposition chambers and a process for the substrate is performed, the substrate supporter being coupled to the transferring guide such that the substrate supporter is moved along the transferring guide; and
 a deposition material supplying member for supplying a deposition material to the substrate supported by the substrate supporter, the deposition material supplying member being disposed under the transferring guide positioned in the deposition chamber,
 wherein the substrate supporter is moved between the process chambers through the opening along the transferring guide and the process for the substrate is performed while the substrate is supported by the substrate supporter coupled to the transferring guide, and
 each of the process chambers includes
 a mask attaching chamber in which a process for attaching a mask having a predetermined pattern to the substrate is performed, the mask attaching chamber being installed at a first side of the deposition chamber and provided with an opening through which the substrate is moved, and
 a mask detaching chamber in which a process for detaching the mask from the substrate is performed, the mask detaching chamber being installed at a second side of the deposition chamber and provided with an opening through which the substrate is moved.

2. The substrate processing apparatus of claim 1, further comprising:
 a gate valve for opening or closing the opening to allow inner portions of the process chambers to be separated from each other,
 wherein inner portions of the deposition chambers are maintained in a vacuum state when the process for the substrate is performed.

3. The substrate processing apparatus of claim 1, further comprising:
   at least one gate valve configured to open and close at least one of the mask attaching chamber openings and the mask detaching chamber openings,
   wherein inner portions of the deposition chambers are maintained in a vacuum state when the process for the substrate is performed, the mask attaching chamber, the deposition chamber and the mask detaching chamber are divided into one or more groups, and the at least one gate valve opens and closes the at least one of the mask attaching chamber openings and the mask detaching chamber openings to allow the substrate to move between the groups of the mask attaching chamber, the deposition chamber and the mask detaching chamber.

4. The substrate processing apparatus of claim 1, wherein the substrate is a substrate used to fabricate an organic light emitting diode.

5. The substrate processing apparatus of claim 1, wherein the substrate supporter comprises an adhere-layer formed on a lower face thereof, and the substrate is attached to the substrate supporter by the adhere-layer.

6. The substrate processing apparatus of claim 1, wherein the deposition material supplying member comprises:
   a supplying container for containing the deposition material; and
   a heating member for heating the supplying container such that the deposition material is supplied to the substrate when the process for the substrate is performed.

7. The substrate processing apparatus of claim 1, further comprising:
   a blocking plate through which an opening facing an upper portion of the deposition material supplying member is formed, the blocking plate being installed between the substrate attached to the substrate supporter and the deposition material supplying member,
   wherein the blocking plate prevents the deposition material supplied from the deposition material supplying member from being moved through the opening of the deposition chamber or deposited at the transferring guide.

8. The substrate processing apparatus of claim 7, wherein the substrate supporter is continuously moved along the transferring guide when the process for the substrate is performed.

9. The substrate processing apparatus of claim 7, wherein the substrate supporter is moved after the substrate supporter is stayed in a predetermined position by a predetermined time when the process for the substrate is performed.

10. The substrate processing apparatus of claim 1, further comprising:
    a cover for covering an opening through which the deposition material in the deposition material supplying member is supplied to the deposition chamber.

11. The substrate processing apparatus of claim 1, further comprising:
    a returning guide for returning the substrate supporter from which the substrate is detached, the returning guide being disposed on the transferring guide in the process chambers,
    wherein the substrate supporter moves the mask from the mask detaching chamber to the mask attaching chamber while returning along the transferring guide.

12. The substrate processing apparatus of claim 1, further comprising:
    a mask returning member for moving the mask from the mask detaching chamber to the mask attaching chamber along transferring guide,
    wherein the deposition chamber provides a buffer space therein at which the mask returning member temporarily stays.

13. The substrate processing apparatus of claim 12, wherein the buffer space is provided at an upper portion of the transferring guide of the deposition chamber.

14. The substrate processing apparatus of claim 12, further comprising:
    a returning guide for returning a substrate transferring member that transfers the substrate between the process chambers,
    wherein the returning guide is installed outside the process chambers.

15. The substrate processing apparatus of claim 12, wherein the buffer space is provided inside the mask attaching chamber and the mask detaching chamber are provided with a buffer space, at which the mask returning member temporarily stays.

16. The substrate processing apparatus of claim 1, wherein the substrate supporter comprises:
    a supporting plate for supporting the substrate; and
    a driving roller that rolls on an upper face of the transferring guide when the supporting plate is transferred along the transferring guide, the driving roller being combined with a lower face of the supporting plate.

17. The substrate processing apparatus of claim 16, wherein the substrate supporter further comprises a guide roller that rolls along a side face of the transferring guide in order to prevent deviation of the supporting plate from the transferring guide toward a direction substantially perpendicular to a longitudinal direction of the transferring guide when the supporting plate is transferred along the transferring guide.

18. The substrate processing apparatus of claim 16, wherein the lower face of the supporting plate comprises:
    a center portion for supporting the substrate;
    an end portion at which the driving roller is installed; and
    a first bend portion formed between the center portion and the end portion,
    wherein the upper face of the transferring guide comprises:
        a road portion that makes contact with the driving roller; and
        a second bend portion that faces the first bend portion and that is corresponding to the first bend portion.

19. The substrate processing apparatus of claim 16, further comprising:
    a driver for driving the substrate supporter,
    wherein the driver includes
        a rack gear formed on a sidewall of the supporting plate,
        a pinion gear combined with the rack gear,
        a first rotation axle rotated by a motor,
        a first magnetic substance into which the first rotation axle is inserted,
        a second rotation axle for rotating the pinion gear, the second rotation axle being substantially perpendicular to the first rotation axle, and
        a second magnetic substance for transmitting a rotational force from the first rotation axle to the second rotation axle, the second rotation axle being inserted into the second magnetic substance and the second magnetic substance being substantially perpendicular to the first magnetic substance.

20. The substrate processing apparatus of claim 1, wherein the substrate supporter includes an adhere-layer on a lower face thereof, the adhere-layer being configured to support the substrate so the substrate is below the adhere-layer, the substrate supporter being further configured to support the mask so the substrate is between the adhere-layer and the mask.

21. The substrate processing apparatus of claim 1, wherein the mask attaching chamber includes a mask mover to move the mask towards the substrate supporter to sandwich the substrate between an adhere-layer of the substrate supporter and the mask.

* * * * *